(12) United States Patent
Devos et al.

(10) Patent No.: US 11,356,046 B2
(45) Date of Patent: Jun. 7, 2022

(54) ELECTRONIC DEVICE AND METHOD FOR DETERMINING AT LEAST ONE CHARACTERISTIC PARAMETER OF AN ELECTRIC MACHINE CONNECTED TO AN ELECTRIC STARTER, RELATED POWER SUPPLY CHAIN AND COMPUTER PROGRAM

(71) Applicant: Schneider Toshiba Inverter Europe SAS, Pacy sur Eure (FR)

(72) Inventors: Thomas Devos, Carrières sous Poissy (FR); François Malrait, Jouy sur Eure (FR)

(73) Assignee: Schneider Toshiba Inverter Europe SAS, Pacy sur Eure (FR)

( * ) Notice: Subject to any disclaimer, the term of this patent is extended or adjusted under 35 U.S.C. 154(b) by 0 days.

(21) Appl. No.: 17/107,995

(22) Filed: Dec. 1, 2020

(65) Prior Publication Data
US 2021/0167711 A1 Jun. 3, 2021

(30) Foreign Application Priority Data
Dec. 3, 2019 (EP) .................................... 19306561

(51) Int. Cl.
*G01R 27/08* (2006.01)
*H02P 23/14* (2006.01)
(Continued)

(52) U.S. Cl.
CPC ............. *H02P 23/14* (2013.01); *G01R 27/08* (2013.01); *G01R 27/2611* (2013.01); *G01R 31/343* (2013.01); *H02P 1/16* (2013.01)

(58) Field of Classification Search
CPC .... G01R 31/34; G01R 31/343; G01R 31/346; G01R 31/1277; G01R 31/12; G01R 31/02;
(Continued)

(56) References Cited

U.S. PATENT DOCUMENTS 4,670,698 A 6/1987 Fulton et al.
9,729,099 B1 * 8/2017 Lovas ..................... H02P 6/182
(Continued)

FOREIGN PATENT DOCUMENTS

EP 2320559 A2 5/2011

OTHER PUBLICATIONS

Extended European Search Report for European Application No. 19306561.2-1202, dated May 29, 2020, 7 pages.

*Primary Examiner* — Thang X Le
(74) *Attorney, Agent, or Firm* — Locke Lord LLP

(57) ABSTRACT

An electronic determination device is configured for determining at least one characteristic parameter of an electric machine with P phases, P≥3, connected to an electric starter and including at least P-1 switching arms, each switching arm being connected to a respective phase of the electric machine. The determination device comprises a control module configured to control respective switching arm(s) to close and the other switching arm(s) to open, so as to generate a current injection on two phases of the electric machine; an acquisition module configured to acquire measurements of respective current(s) and voltage(s) for said two phases, further to the generation of the current injection; and a calculation module configured to calculate at least one characteristic parameter of the electric machine according to the respective current(s) and voltage(s) measurements.

14 Claims, 5 Drawing Sheets

(51) Int. Cl.
 *G01R 27/26* (2006.01)
 *G01R 31/34* (2020.01)
 *H02P 1/16* (2006.01)

(58) Field of Classification Search
 CPC ...... G01R 31/025; G01R 31/06; G01R 27/08;
  G01R 27/2611; H02P 1/16; H02P 23/14
 See application file for complete search history.

(56) References Cited

U.S. PATENT DOCUMENTS

| | | | |
|---|---|---|---|
| 9,831,806 B2* | 11/2017 | Sugimori | H02P 6/12 |
| 2010/0156338 A1 | 6/2010 | Lu et al. | |
| 2011/0102012 A1* | 5/2011 | Messersmith | H02P 23/14 |
| | | | 324/765.01 |
| 2017/0155347 A1* | 6/2017 | Park | H02P 27/08 |
| 2018/0138844 A1* | 5/2018 | Harada | H02P 6/28 |
| 2018/0287525 A1* | 10/2018 | Aoki | H02P 6/182 |

* cited by examiner

US 11,356,046 B2

ELECTRONIC DEVICE AND METHOD FOR DETERMINING AT LEAST ONE CHARACTERISTIC PARAMETER OF AN ELECTRIC MACHINE CONNECTED TO AN ELECTRIC STARTER, RELATED POWER SUPPLY CHAIN AND COMPUTER PROGRAM

FIELD OF THE INVENTION

The present invention relates to an electronic determination device for determining at least one characteristic parameter of an electric machine connected to an electric starter.

The invention also relates to a power supply chain for an electric machine, the power supply chain comprising an electric starter being adapted to be connected between an alternative power source and the electric machine, and such an electronic determination device for determining at least one characteristic parameter of the electric machine.

The invention also relates to a determination method for determining at least one characteristic parameter of an electric machine connected to an electric starter, the method being implemented by such an electronic determination device.

The invention also relates to a computer program including software instructions which, when executed by a processor, implement such a determination method.

BACKGROUND OF THE INVENTION

This invention concerns the evaluation of characteristic parameter(s) of an electric machine, in particular of an electric motor.

Currently, with a variable speed drive, it's possible to evaluate characteristic parameter(s) of an electric machine, while the variable speed drive can generate any voltage waveforms thanks to pulse width modulation techniques and power electronics switches.

Such characteristic parameter(s) then allow estimating mechanical torque and mechanical speed. For instance, it allows to estimating the losses of the electric machine that are important for the quality and performance of the torque estimation, and then the torque control.

With an electric starter, voltage waveforms are fully constraint to be pieces of mains supply. Currently, there is no full identification of the machine parameter(s) with an electric starter.

Currently with an electric starter, the losses are therefore adjusted approximately by a user.

However, it can be difficult to know what value of the losses shall be entered since it depends on the electric machine. Moreover, this value of the losses is also influenced by the resistance of the cable connected between the electric starter and the electric machine.

SUMMARY OF THE INVENTION

An object of the invention is therefore to provide an electronic determination device and related method for determining at least one characteristic parameter of an electric machine connected to an electric starter, which allow an easier and more precise determination of said characteristic parameter(s).

For this purpose, the subject-matter of the invention is an electronic determination device for determining at least one characteristic parameter of an electric machine connected to an electric starter, the electric machine having P phases, P being an integer greater than or equal to 3, the electric starter being adapted to be connected to an alternative power source and including at least P-1 switching arms, each switching arm being connected to a respective phase of the electric machine, the determination device comprising:
a control module configured to control respective switching arm(s) to close and the other switching arm(s) to open, so as to generate a current injection on two phases of the electric machine;
an acquisition module configured to acquire measurements of respective current(s) and voltage(s) for said two phases, further to the generation of the current injection; and
a calculation module configured to calculate at least one characteristic parameter of the electric machine according to the respective current(s) and voltage(s) measurements.

The determination device according to the invention therefore allows using the switching arms of the starter in order to generate a current injection in the electric machine at standstill. Indeed, since the control module controls the switching arm(s) of at least one phase to open, the machine is at standstill. The current injection is generated on two other phases of the electric machine. The calculation module then calculates at least one characteristic parameter of the electric machine in a convenient and precise manner according to the respective current(s) and voltage(s) measurements for said two other phases.

According to other advantageous aspects of the invention, the electronic determination device comprises one or several of the following features, taken individually or according to any technically possible combination:
each characteristic parameter is chosen from among the group consisting of:
a stator resistance of the electric machine;
a rotor resistance of the electric machine;
a leakage inductance of the electric machine; and
a main inductance of the electric machine;
the control module is configured, further to the generation of the current injection occurring at an initial time instant, to control at an end time instant the respective previously closed switching arm(s) to open, so as to switch off the current injection;
a duration of the current injection between the initial time instant and the end time instant being preferably a predefined time period;
the predefined time period being preferably greater than five times a rotor time constant;
the calculation module is configured to calculate a value of a stator voltage for a stator of the electric machine from the voltages measurements for said two phases, and respectively a value of a stator current for the stator from the currents measurements for said two phases, the calculation module being further configured to calculate the at least one characteristic parameter of the electric machine according to said stator voltage and stator current values;
the calculation module is configured to calculate the respective stator voltage and stator current values according to a transformation applied to the respective voltages measurements and currents measurements for said two phases;
the calculation module being preferably configured to calculate the respective stator voltage and stator current values according to the following equations:

$$U_s = \frac{U_1 - U_2}{2}$$

$$I_s = I_1 = -I_2$$

where $U_s$ represents the stator voltage, $U_1$, and respectively $U_2$, represent the voltage in a first phase, and respectively in a second phase;

$I_s$ represents the stator current, and $I_1$, and respectively $I_2$, represent the current in a first phase, and respectively in a second phase;

the calculation module is configured to calculate a total resistance of the electric machine from the stator voltage and stator current at a time instant corresponding to a maximum of the stator current further to the generation of the current injection, the total resistance being equal to the sum of a stator resistance and a rotor resistance of the electric machine;

the calculation module being preferably configured to calculate the total resistance according to the following equation:

$$R_{tot} = (R_s + R_{req}) = \frac{U_s(t_0)}{I_s(t_0)}$$

where $R_{tot}$ represents the total resistance, $U_s$ represents the stator voltage, $I_s$ represents the stator current, and $t_0$ represents the time instant corresponding to a maximum of the stator current;

the calculation module is configured to calculate a leakage inductance of the electric machine from the stator voltage and a time derivative of the stator current further to the generation of the current injection;

the calculation module being preferably configured to calculate the leakage inductance according to the following equation:

$$L_f \frac{dI_s}{dt} = U_s$$

where $L_f$ represents the leakage inductance, $U_s$ represents the stator voltage, and $I_s$ represents the stator current;

the calculation module is configured to calculate a stator resistance of the electric machine from an integral of the stator voltage and an integral of the stator current over the duration of the current injection;

the calculation module being preferably configured to calculate the stator resistance according to the following equation:

$$R_s = -\frac{\int_{t_{init}}^{t_{end}=t_{init}+T} U_s dt}{\int_{t_{init}}^{t_{end}=t_{init}+T} I_s dt}$$

where $R_s$ represents the stator resistance, $U_s$ represents the stator voltage, $I_s$ represents the stator current, $t_{init}$ represents the initial time instant of the measurement during current injection, $t_{end}$ represents the end time instant of said measurement, and T represents the duration of said measurement;

the calculation module is configured to calculate a main inductance of the electric machine from a leakage inductance of the electric machine, the stator current and an integral of a stator flux over the duration of the current injection;

the calculation module being preferably configured to calculate the main inductance according to the following equation:

$$L = \frac{(\varphi_s - L_f I_s)}{I_s}$$

where L represents the main inductance, $L_f$ represents the leakage inductance, $I_s$ represents the stator current, and $\varphi_s$ represents the integral of the stator flux over duration of the current injection;

$\varphi_s$ being preferably defined according to the following equation:

$$\varphi_s = \int_{t_{init}}^{t_{end}=t_{init}+T}(U_s - R_s I_s)dt$$

$R_s$ represents the stator resistance, $U_s$ represents the stator voltage, $I_s$ represents the stator current, $t_{init}$ represents the initial time instant of the current injection, $t_{end}$ represents the end time instant of the current injection, and T represents the duration of the current injection;

P is equal to 3;

the determination device is configured to determine a respective characteristic parameter of the electric machine in at least two successive sequences, and wherein, during each sequence, the control module is configured to control respective switching arm(s) to close and the other switching arm to open, so as to generate a current injection on two phases of the electric machine; the acquisition module being configured to acquire measurements of respective current(s) and voltage(s) for said two phases, further to the generation of the current injection; and the calculation module being configured to calculate the characteristic parameter of the electric machine according to the respective current(s) and voltage(s) measurements for the respective sequence, and wherein the open switching arm varies from one sequence to the other, so that each one of at least two switching arms is opened once during the successive sequences;

the determination device further comprises a diagnostic module configured to compare the at least two values determined for a respective characteristic parameter over the successive sequences and to generate an alarm signal in the event of a deviation between these at least two determined values exceeding a predefined threshold.

The subject-matter of the invention is also a power supply chain for an electric machine, the electric machine having P phases, P being an integer greater than or equal to 3, the power supply chain comprising:

an electric starter being adapted to be connected between an alternative power source and the electric machine, the electric starter including at least P-1 switching arms, each switching arm being adapted to be connected to a respective phase of the electric machine, an electronic determination device for determining at least one characteristic parameter of the electric machine, the electronic determination device being as defined above.

The subject-matter of the invention is also a method for determining at least one characteristic parameter of an electric machine connected to an electric starter, the electric machine having P phases, P being an integer greater than or equal to 3, the electric starter being adapted to be connected to an alternative power source and including at least P-1 switching arms, each switching arm being connected to a respective phase of the electric machine, the method being implemented by an electronic determination device and comprising the following steps:
control respective switching arm(s) to close and the other switching arm(s) to open, so as to generate a current injection on two phases of the electric machine;
acquire measurements of respective current(s) and voltage(s) for said two phases, further to the generation of the current injection; and
calculate at least one characteristic parameter of the electric machine according to the respective current(s) and voltage(s) measurements.

The subject-matter of the invention is also a computer program including software instructions which, when executed by a processor, implement a method as defined above.

BRIEF DESCRIPTION OF THE DRAWINGS

The invention will be better understood upon reading of the following description, which is given solely by way of example and with reference to the appended drawings, wherein.

DETAILED DESCRIPTION OF PREFERRED EMBODIMENTS

Figure 1:
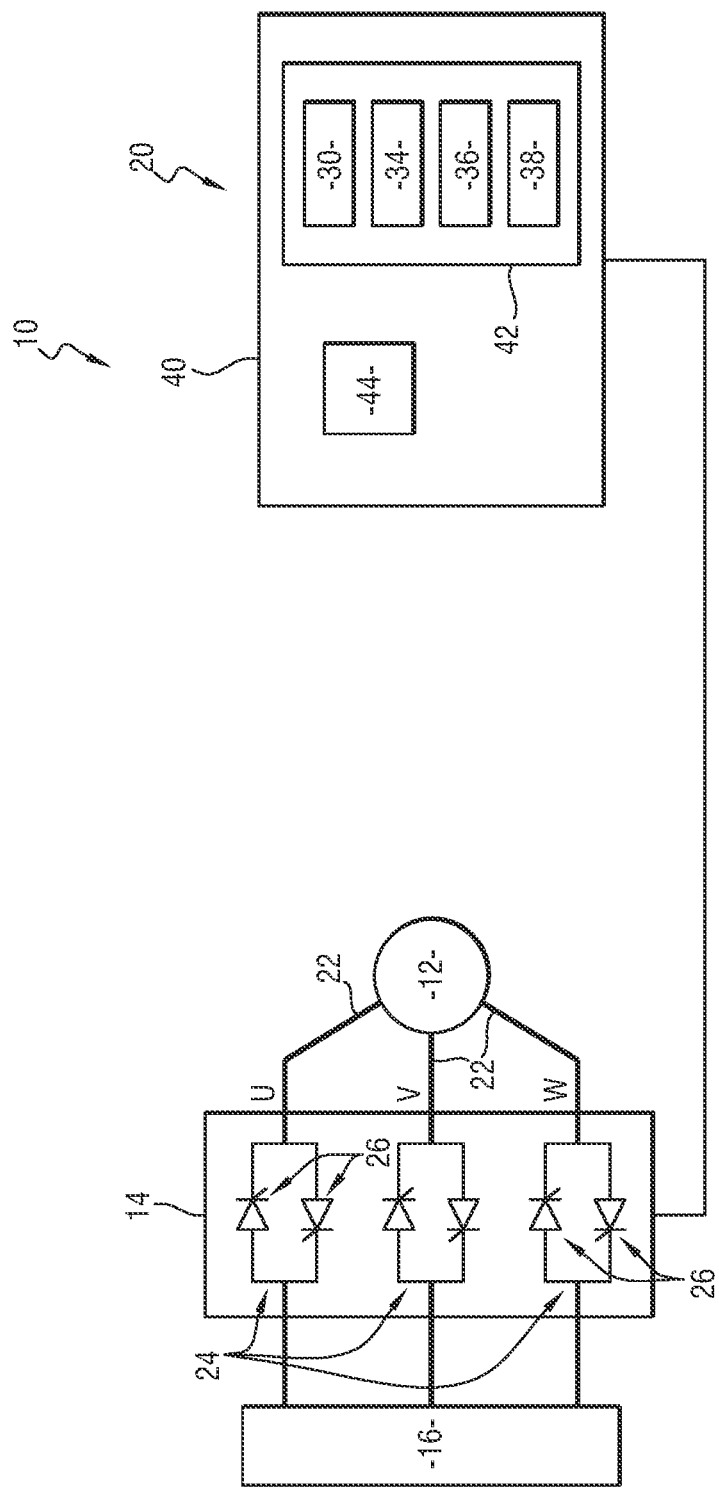
FIG. 1 is a schematic representation of a power supply chain for an electric machine, the power supply chain comprising an electric starter adapted to be connected between an alternative power source and the electric machine, and an electronic determination device for determining at least one characteristic parameter of the electric machine, according to a first embodiment.

In FIG. 1, a power supply chain 10 for an electric machine 12 comprises an electric starter 14 connected between an alternative power source 16 and the electric machine 12, and an electronic determination device 20 for determining at least one characteristic parameter, such as a stator resistance $R_s$, an equivalent rotor resistance $R_{req}$, a leakage inductance Lf, or a main inductance L of the electric machine 12.

The electric machine 12 has P phases 22, P being an integer greater than or equal to 3. The electric machine 12 is a motor or a generator.

In the example of FIG. 1, the electric machine 12 is a three-phase machine, and P is equal to 3, the three phases 22 being respectively denoted U, V, W.

The electric starter 14 includes at least P-1 switching arms 24, each switching arm 24 being adapted to be connected to a respective phase 22 of the electric machine 12. Each switching arm 24 is switchable between a closed position in which the current flows through said arm and an open position in which no current flows through said arm. Each switching arm 24 includes at least one switch 26. Preferably, each switching arm 24 includes two switches 26 connected in anti-parallel, as represented in FIG. 1. In this example, each switching arm 24 consists of two switches 26 connected in anti-parallel. Each switch 26 is a controllable switch, for example a thyristor as shown in FIG. 1, or a transistor.

When a respective switch 26 is a thyristor, the skilled person will understand that the expression "to open" related to the switching arm(s) 24 including such a switch 26 should be understood as "to be kept open". Indeed, a thyristor can be controlled to be closed, but opens itself according to forward current condition, going back to zero.

In the example of FIG. 1, the electric starter 14 includes P switching arms 24, namely a switching arm 24 for each respective phase 22 of the electric machine 12.

The alternative power source 16 is known per se, with also P phases.

The determination device 20 is configured for determining the at least one characteristic parameter $R_s$, $R_{req}$, Lf, L of the electric machine 12. Each characteristic parameter is preferably chosen from among the group consisting of: a stator resistance $R_s$ of the electric machine 12; a rotor resistance $R_{req}$ of the electric machine 12; a leakage inductance Lf of the electric machine 12; and a main inductance L of the electric machine 12.

Figure 2:
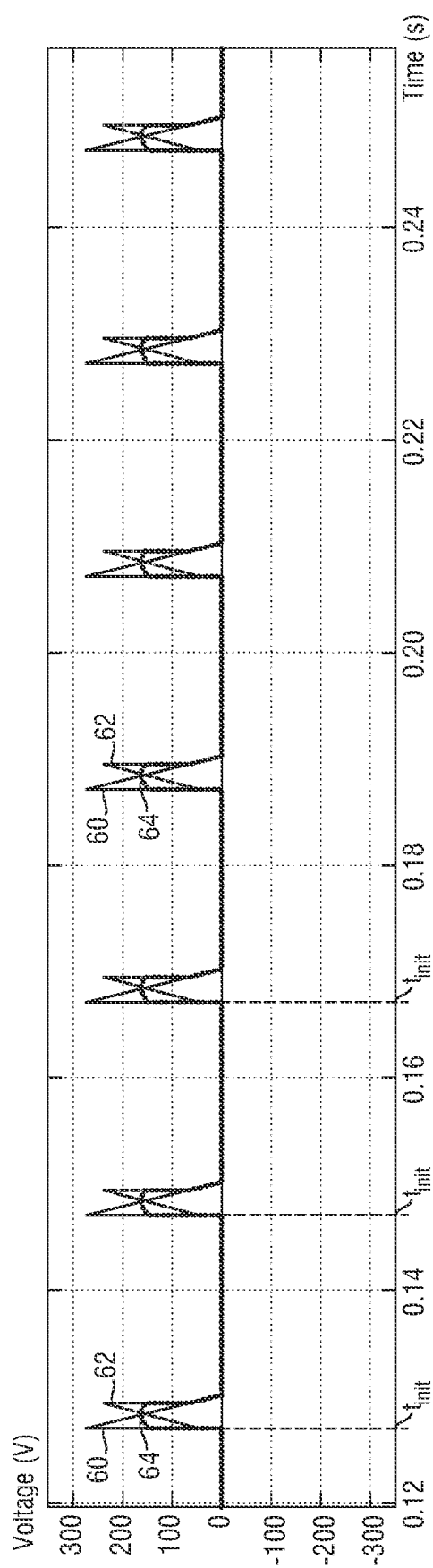
FIG. 2 is a view representing voltage and current curves during successive current injections in the electric machine, said injections being controlled via the electric starter and by the determination device of FIG. 1.
Figure 2:
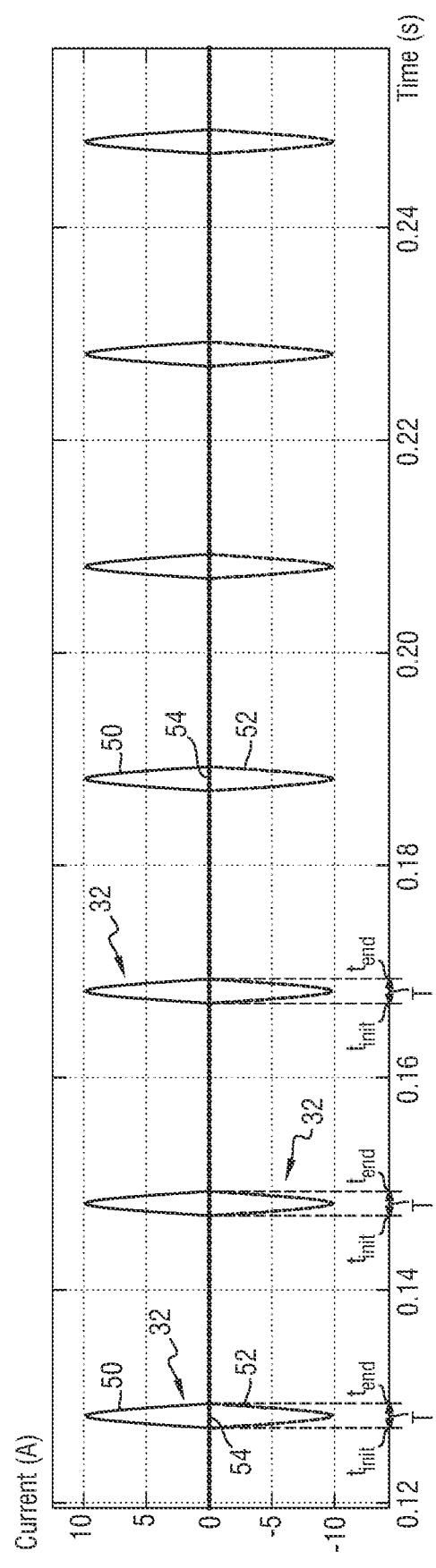

The determination device 20 comprises a control module 30 for controlling the switching arms 24 of the electric starter 14, so as to generate a current injection 32 on two phases 22 of the electric machine 12, as shown in FIG. 2 and explained in further detail hereinafter.

The determination device 20 further comprises an acquisition module 34 for acquiring measurements of respective currents $I_1$, $I_2$ and voltages $U_1$, $U_2$ for said two phases, further to the generation of the current injection 32.

The determination device 20 also comprises a calculation module 36 for calculating the at least one characteristic parameter $R_s$, $R_{req}$, Lf, L of the electric machine 12 according to the respective currents $I_1$, $I_2$ and voltages $U_1$, $U_2$ measurements.

As an optional aspect, the determination device 20 is configured for determining a respective characteristic parameter $R_s$, $R_{req}$, Lf, L of the electric machine 12 in at least two successive sequences. According to this optional aspect, the control module 30 is configured to control the switching arms 24 of the electric starter 14, so as to generate a current injection 32 on two phases 22 of the electric machine 12, in particular to control respective switching arm(s) 24 to close and another switching arm 24 to open; the acquisition module 34 being configured to acquire measurements of respective current(s) and voltage(s) for said two phases 22, further to the generation of the current injection 32; and the calculation module 36 being configured to calculate the characteristic parameter $R_s$, $R_{req}$, Lf, L of the electric machine 12 according to the respective current(s) and voltage(s) measurements for the respective sequence. Further, the open switching arm 24 varies from one sequence to the other, preferably so that each one of at least two switching arms 24 is opened once during the successive sequences.

According to this optional aspect, the determination device 20 further comprises a diagnostic module 38 for comparing the at least two values determined for a respective characteristic parameter $R_s$, $R_{req}$, Lf, L over the successive sequences and for generating an alarm signal in the event of a deviation between these at least two determined values exceeding a predefined threshold.

In the example of FIG. 1, the electronic determination device 20 includes a processing unit 40 formed for example of a memory 42 and of a processor 44 coupled to the memory 42.

In the example of FIG. 1, the control module 30, the acquisition module 34 and the calculation module 36, as well as in optional aspect the diagnostic module 38, are for example each realized, i.e. implemented, as a software executable by the processor 44. The memory 42 of the processing unit 40 is adapted to store a control software for controlling the switching arms 24 of the electric starter 14, so as to generate a current injection 32 on two phases 22 of the electric machine 12; an acquisition software for acquiring measurements of respective currents $I_1$, $I_2$ and voltages $U_1$, $U_2$ for said two phases, further to the generation of the current injection 32; and a calculation software for calculating the at least one characteristic parameter $R_s$, $R_{req}$, Lf, L of the electric machine 12 according to the respective currents $I_1$, $I_2$ and voltages $U_1$, $U_2$ measurements; as well as in optional aspect, a diagnostic software for comparing the at least two values determined for a respective characteristic parameter $R_s$, $R_{req}$, Lf, L over the successive sequences and for generating an alarm signal in the event of a deviation between these at least two determined values exceeding a predefined threshold. The processor 44 of the processing unit 40 is then configured to execute the control software, the acquisition software, and the calculation software, as well as in optional aspect the diagnostic software.

As a variant not shown, the control module 30, the acquisition module 34 and the calculation module 36, as well as in optional aspect the diagnostic module 38, are each in the form of a programmable logic component, such as a Field Programmable Gate Array or FPGA, or in the form of a dedicated integrated circuit, such as an Application Specific integrated Circuit or ASIC.

When the electronic determination device 20 is in the form of one or more software programs, i.e. in the form of a computer program, it is also capable of being recorded on a computer-readable medium, not shown. The computer-readable medium is, for example, a medium capable of storing electronic instructions and being coupled to a bus of a computer system. For example, the readable medium is an optical disk, a magneto-optical disk, a ROM memory, a RAM memory, any type of non-volatile memory (for example EPROM, EEPROM, FLASH, NVRAM), a magnetic card or an optical card. A computer program with software instructions is then stored on the readable medium.

The control module 30 is configured to control respective switching arm(s) 24 to close and the other switching arm(s) 24 to open, so as to generate the current injection 32 on two phases 22 of the electric machine 12.

The skilled person will understand that when the control module 30 controls switching arm(s) 24 to close, it means that said switching arm(s) 24 are switched to their closed position; and respectively when the control module 30 controls switching arm(s) 24 to open, it means that said switching arm(s) 24 are switched to their open position.

When the electric starter 14 includes P switching arms 24, namely a switching arm 24 for each respective phase 22 of the electric machine 12, the control module 30 is configured to control two respective switching arms 24 to close and the other switching arm(s) 24 to open, so as to generate the current injection 32 on said two phases 22. In other words, when the electric starter 14 includes P switching arms 24, the control module 30 is configured to control two respective switching arms 24 to close and (P-2) switching arm(s) 24 to open, so as to generate said current injection 32. In the example of FIGS. 1 and 2, where P is in particular equal to 3, the control module 30 is therefore configured to control two respective switching arms 24 to close and the other switching arm 24 to open, so as to generate said current injection 32.

In the example of FIG. 2, the control module 30 is configured to control the switching arms 24 for phases U, V to close and the other switching arm 24 for phase W to open, so as to generate the current injection 32 on phases U, V. In FIG. 2, a first current curve 50, and respectively a second current curve 52, represent a current of the electric machine 12, hereinafter called machine current, and respectively the machine current in phase V, while a third current curve 54 represents the machine current in phase W, said third current curve 54 being null since the switching arm 24 for phase W remains open in this example. In this FIG. 2, a first voltage curve 60, and respectively a second voltage curve 62, represent a voltage of the electric machine 12, hereinafter called machine voltage, in phase U, and respectively the machine voltage in phase V, while a third voltage curve 64 represents the machine voltage in phase W.

In addition, the control module 30 is configured, further to the generation of the current injection 32 occurring at an initial time instant $t_{init}$, to control at an end time instant $t_{end}$ the respective previously closed switching arms 24 to open, so as to switch off the current injection 32.

A duration of the current injection 32 between the initial time instant $t_{init}$ and the end time instant $t_{end}$ is preferably a predefined time period T, shown in FIG. 2. The predefined time period T is preferably greater than five times a rotor time constant Tr. This ratio between the predefined time period T and the rotor time constant Tr allows to have the stabilization of a flux of the electric machine 12, in particular for the calculation of the stator resistance $R_s$.

In optional addition, to avoid a knowledge on a power of the electric machine 12, the duration time is chosen according to the power of the electric starter 14 or else is fixed, with no dependency on the power of the electric machine 12 or of the electric starter 14. In this latter case, predefined time period T is for example equal to 10 seconds, which covers all the power range of the electric machine 12.

Further to the generation of the current injection 32 at the initial time instant $t_{init}$ and during said current injection, i.e. before the end time instant $t_{end}$, the acquisition module 34 is configured to acquire measurements of respective current(s) and voltage(s) for said two phases 22 where the current injection 32 is present. For example, the acquisition module 34 is configured to acquire measurements of a first current $I_1$ and a first voltage $U_1$ in a first phase 22, and respectively of a second current $I_2$ and a second voltage $U_2$ in a second phase 22, where the current injection 32 is present.

The calculation module 36 is configured to calculate the at least one characteristic parameter $R_s$, $R_{req}$, Lf, L of the electric machine 12 according to said respective current(s) $I_1$, $I_2$ and voltage(s) $U_1$, $U_2$ measurements.

The calculation module 36 is for example configured to calculate a value of a stator voltage $U_s$ for a stator of the electric machine 12 from the voltages measurements $U_1$, $U_2$ for said two phases 22, and respectively a value of a stator current $I_s$ for the stator from the currents measurements $I_1$, $I_2$ for said two phases 22, the calculation module 36 being further configured to calculate the at least one characteristic parameter $R_s$, $R_{req}$, Lf, L of the electric machine 12 according to said stator voltage $U_s$ and stator current $I_s$ values.

According to this example, the calculation module 36 is typically configured to calculate the respective stator voltage $U_s$ and stator current $I_s$ values according to a transformation applied to the respective voltages measurements $U_1$, $U_2$ and currents measurements $I_1$, $I_2$ for said two phases 22. The applied transformation is for example a Clark's transformation.

According to this example, the calculation module 36 is preferably configured to calculate the respective stator voltage $U_s$ and stator current $I_s$ values via the following equations:

$$U_s = \frac{U_1 - U_2}{2} \quad (1)$$

$$I_s = I_1 = -I_2 \quad (2)$$

where $U_s$ represents the stator voltage, $U_1$, and respectively $U_2$, represent the voltage in a first phase 22, and respectively in a second phase 22;

$I_s$ represents the stator current, and $I_1$, and respectively $I_2$, represent the current in a first phase 22, and respectively in a second phase 22.

The calculation module 36 is alternatively configured to calculate the respective stator voltage $U_s$ and stator current $I_s$ values via the following equations:

$$U_s = \frac{1}{2\sqrt{3}} \begin{pmatrix} \sqrt{3} \\ -1 \end{pmatrix} (U_1 - U_2) \quad (3)$$

$$I_s = \frac{1}{\sqrt{3}} \begin{pmatrix} \sqrt{3} \\ -1 \end{pmatrix} I_1 = \frac{1}{\sqrt{3}} \begin{pmatrix} -\sqrt{3} \\ 1 \end{pmatrix} I_2 \quad (4)$$

where $U_s$, $U_1$, $U_2$, $I_s$, $I_1$ and $I_2$ represent the same variables as the ones aforementioned for equations (1) and (2).

When the calculated characteristic parameter of the electric machine 12 is the stator resistance $R_s$, the calculation module 36 is for example configured to calculate said stator resistance $R_s$ from an integral of the stator voltage $U_s$, such as the one defined by equation (1), and an integral of the stator current $I_s$, such as the one defined by equation (2), over the duration of the current injection 32.

According to this example, the calculation module 36 is preferably configured to calculate the stator resistance $R_s$ via the following equation:

$$R_s = -\frac{\int_{t_{init}}^{t_{end}=t_{init}+T} U_s dt}{\int_{t_{init}}^{t_{end}=t_{init}+T} I_s dt} \quad (5)$$

where $R_s$ represents the stator resistance;

$U_s$ represents the stator voltage;

$I_s$ represents the stator current;

$t_{init}$ represents the initial time instant of the measurement during current injection 32; alternatively, the initial time instant is equal to 0, i.e. the beginning of the sequence;

$t_{end}$ represents the end time instant of said measurement, alternatively, the end time is at the end of the full sequence; and T represents the duration of said measurement.

Alternatively, the calculation module 36 is configured to calculate a ratio between a filtering of the stator voltage $U_s$ and a filtering of the stator current Is.

Since the stator voltage $U_s$ and the stator current $I_s$ are typically vectors, there are different variants to calculate the stator resistance $R_s$ of the electric machine 12.

According to a first variant, the stator resistance $R_s$ is calculated on each direction of a representative frame, such as a dq frame, known per se.

According to a second variant, the stator resistance $R_s$ is calculated based on the module of the vectors, i.e. via the following equation:

$$R_s = \left| \frac{\int_{t_{init}}^{t_{end}=t_{init}+T} U_s dt}{\int_{t_{init}}^{t_{end}=t_{init}+T} I_s dt} \right| = \sqrt{R_{sd}^2 + R_{sq}^2} \quad (6)$$

where $R_{sd}$ represents the stator resistance $R_s$ on the d axis of the dq frame, and $R_{sq}$ represents the stator resistance $R_s$ on the q axis of said dq frame.

When the calculated characteristic parameter of the electric machine 12 is the rotor resistance $R_{req}$, the calculation module 36 is further configured to calculate a total resistance $R_{tot}$ of the electric machine 12 from the stator voltage $U_s$ and stator current $I_s$ at a time instant to corresponding to a maximum of the stator current $I_s$ further to the generation of the current injection 32, the total resistance $R_{tot}$ being equal to the sum of the stator resistance $R_s$ and the rotor resistance $R_{req}$.

According to this example, the calculation module 36 is preferably configured to calculate the total resistance $R_{tot}$ via the following equation:

$$R_{tot} = R_s + R_{req} = \frac{U_s(t_0)}{I_s(t_0)} \quad (7)$$

where $R_{tot}$ represents the total resistance, $U_s$ represents the stator voltage, $I_s$ represents the stator current, and $t_0$ represents the time instant corresponding to a maximum of the stator current.

Alternatively, the calculation module 36 is configured to calculate a function of respective averages of the stator voltage $U_s$ and the stator current Is when arm is closed, i.e. while the current is non zero.

The calculation module 36 is then configured to determine a value of the rotor resistance $R_{req}$ from the previously calculated values of the stator resistance $R_s$ and the total resistance $R_{tot}$, by subtracting the value of the stator resistance $R_s$ from the value of the total resistance $R_{tot}$.

The time instant $t_0$ corresponding to the maximum of the stator current $I_s$ is typically around 5 ms after the start of the injection, i.e. around 5 ms after the initial time instant $t_{init}$.

As for the stator resistance $R_s$, the calculation of the total resistance $R_{tot}$ is for example done on each direction of the representative frame, such as the dq frame, according to a first variant; or based on the module of the vectors, according to a second variant.

According to said first variant, the value of total resistance $R_{tot}$ is for example the mean of both stator resistance $R_s$ and rotor resistance $R_{req}$. Further, it may allow to detect a problem on the electric machine 12 if there is an important difference between both resistances $R_s$ and $R_{req}$.

According to said second variant, the total resistance $R_{tot}$ is calculated based on the module of the vectors, i.e. via the following equation:

$$(R_s + R_{req}) = \frac{|U_s(t_0)|}{|I_s(t_0)|} \quad (8)$$

In addition, there are also several alternatives to acquire the currents $I_1$, $I_2$ and voltages $U_1$, $U_2$ at the time instant $t_0$ corresponding to the maximum of the stator current $I_s$. According to a first alternative, at each sampling period, the currents $I_1$, $I_2$ and voltages $U_1$, $U_2$ are acquired only if the new value of the current is higher than the previously acquired one. If there is no update during a given time period, for example 10 ms, the last acquired values correspond to the maximum of current and the equivalent voltage. According to a second alternative, the currents $I_1$, $I_2$ and voltages $U_1$, $U_2$ are acquired at each sampling time from the initial time instant $t_{init}$ and this acquisition is stopped when a respective current $I_1$, $I_2$ becomes null. The maximum of current is then obtained by post treatment of the acquired data.

When the calculated characteristic parameter of the electric machine 12 is the leakage inductance Lf, the calculation module 36 is configured to calculate said leakage inductance Lf from the stator voltage $U_s$ and a time derivative of the stator current $I_s$ further to the generation of the current injection 32.

According to this example, the calculation module 36 is preferably configured to calculate the leakage inductance Lf via the following equation:

$$L_f \frac{dI_s}{dt} = U_s \quad (9)$$

where Lf represents the leakage inductance,
$U_s$ represents the stator voltage, and
$I_s$ represents the stator current.

As for the stator resistance $R_s$ and the total resistance $R_{tot}$, the calculation of the leakage inductance Lf is for example done on each direction of the representative frame, such as the dq frame; or based on the module of the vectors.

In addition, there are also several alternatives to compute the time derivative of the stator current $I_s$. According to a first alternative, the calculation module 36 is configured to calculate the leakage inductance Lf via the following equation:

$$L_f = u_s \frac{\Delta T}{\Delta i_s} \quad (10)$$

with $\Delta T$ the time between two acquisition time instants; which leads typically to the following equation:

$$L_f = \left(\frac{u_s(t_2) + u_s(t_1)}{2}\right)\left(\frac{t_2 - t_1}{i_s(t_2) - i_s(t_1)}\right) \quad (11)$$

with $t_2 - t_1 = \Delta T$,
$t_1$, $t_2$ being successive acquisition time instants,
$t_1$ being chosen nearest after the initial time instant $t_{init}$.

According to a second alternative, the currents $I_1$, $I_2$ and voltages $U_1$, $U_2$ are acquired at each sampling time from the initial time instant $t_{init}$, and the time derivative of the stator current $I_s$ is then obtained by post treatment of the acquired data.

When the calculated characteristic parameter of the electric machine 12 is the main inductance L, the calculation module 36 is configured to calculate said main inductance L from the leakage inductance Lf, the stator current $I_s$ and an integral $\varphi_s$ of a stator flux $\Psi_s$ over the duration of the current injection 32.

According to this example, the calculation module 36 is preferably configured to calculate the main inductance L via the following equation:

$$L = \frac{(\varphi_s - L_f I_s)}{I_s} \quad (12)$$

where L represents the main inductance,
Lf represents the leakage inductance,
$I_s$ represents the stator current, and
$\varphi_s$ represents the integral of the stator flux over duration of the current injection 32;
$\varphi_s$ being preferably defined via the following equation:

$$\varphi_s = \int_{t_{init}}^{t_{end} = t_{init} + T}(U_s - R_s I_s)dt \quad (13)$$

$R_s$ represents the stator resistance,
$U_s$ represents the stator voltage,
$I_s$ represents the stator current,
$t_{init}$ represents the initial time instant of the current injection 32,
$t_{end}$ represents the end time instant of the current injection 32, and
T represents the duration of the current injection 32.

As for the stator resistance $R_s$, the total resistance $R_{tot}$ and the leakage inductance Lf, the calculation of the main inductance L is for example done on each direction of the representative frame, such as the dq frame; or based on the module of the vectors.

In addition, there are also several alternatives to compute the integral of equation (13), among which the one wherein the currents $I_1$, $I_2$ and voltages $U_1$, $U_2$ are acquired at each sampling time from the initial time instant $t_{init}$, and said integral is then obtained by post treatment of the acquired data.

The calculation module 36 is therefore configured to calculate the four aforementioned characteristic parameters $R_s$, $R_{req}$, Lf, L of the electric machine 12 during the injection of current, further to the control, by the control module 30, of the respective switching arm(s) 24 to close and the other switching arm(s) 24 to open.

According to the optional aspect, in the example of FIG. 1, the determination device 20 is preferably configured for determining a respective characteristic parameter $R_s$, $R_{req}$, Lf, L of the electric machine 12 in three successive sequences. Therefore, the open switching arm 24 varies from one sequence to the other, preferably so that each one of the three switching arms 24 is opened once during the three successive sequences.

Accordingly, in the example of FIG. 1, the diagnostic module 38 is configured for comparing the at least two values, preferably the three values, determined for a respective characteristic parameter $R_s$, $R_{req}$, Lf, L over the successive sequences and for generating an alarm signal in the event of a deviation between these determined values exceeding a predefined threshold.

Figure 3:
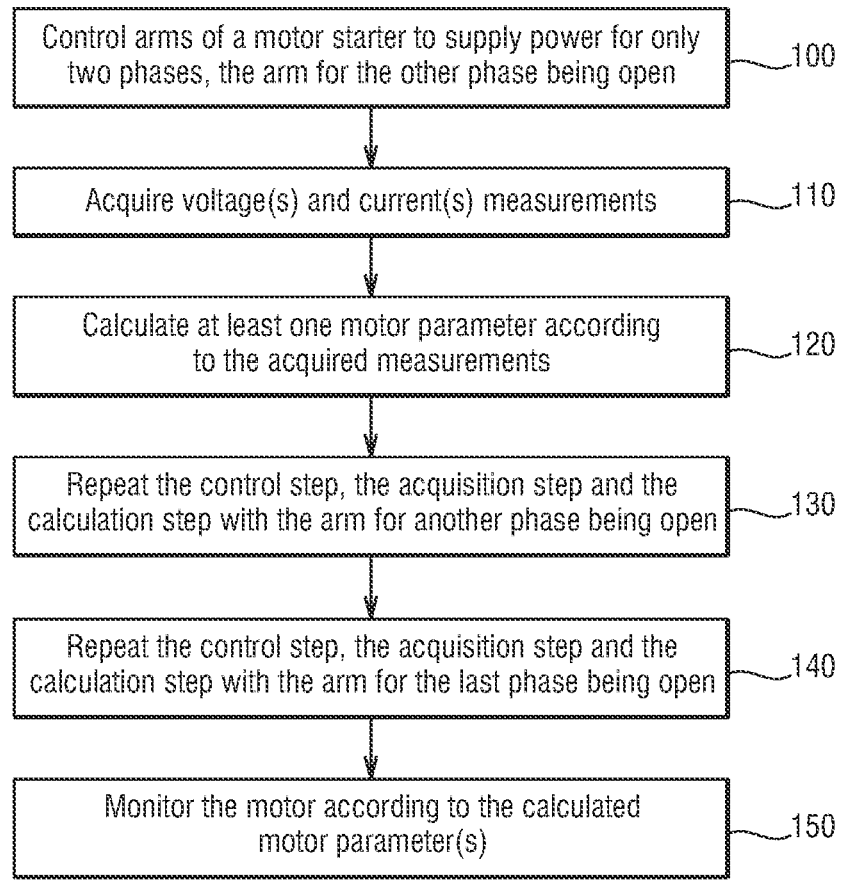
FIG. 3 is a flowchart of a determination method according to the first embodiment, for determining the at least one characteristic parameter of the electric machine, the method being implemented by the determination device of FIG. 1.

The operation of the power supply chain 10, in particular the determination device 20, according to the first embodiment will now be explained in view of FIG. 3 representing a flowchart of a method, according to the first embodiment, for determining the at least one characteristic parameter $R_s$, $R_{req}$, Lf, L of the electric machine 12.

In initial step 100, the electronic determination device 20 controls, via its control module 30, respective switching arm(s) 24 to close and the other switching arm(s) 24 to open, so as to generate the current injection 32 on two phases 22 of the electric machine 12. In particular, when the electric starter 14 includes P switching arms 24, the control module 30 controls two respective switching arms 24 to close and (P-2) switching arm(s) 24 to open, so as to generate said current injection 32. In the example of FIGS. 1 and 2, with P equal to 3, the control module 30 therefore controls two respective switching arms 24 to close and the other switching arm 24 to open, for generating said current injection 32.

Further to the generation of the current injection 32 at the initial time instant $t_{init}$ and during said current injection, i.e. before the end time instant $t_{end}$, the electronic determination device 20 acquires, in step 110 and via its acquisition module 34, measurements of respective current(s) and voltage(s) for said two phases 22 where the current injection 32 is present. In particular, the acquisition module 34 acquires measurements of the first current $I_1$ and the first voltage $U_1$ in the first phase 22, and respectively of the second current $I_2$ and the second voltage $U_2$ in the second phase 22.

In addition, further to the generation of the current injection 32 occurring at an initial time instant $t_{init}$, the control module 30 controls at the end time instant $t_{end}$ the respective previously closed switching arms 24 to open, so as to switch off the current injection 32.

Then, during next step 120, the electronic determination device 20 calculates, via its calculation module 36, the at least one characteristic parameter $R_s$, $R_{req}$, Lf, L of the electric machine 12 according to said respective current(s) $I_1$, $I_2$ and voltage(s) $U_1$, $U_2$ measurements.

The calculation module 36 for example calculates a value of the stator voltage $U_s$ from the voltages measurements $U_1$, $U_2$ for said two phases 22, and respectively a value of the stator current $I_s$ from the currents measurements $I_1$, $I_2$ for said two phases 22, and then calculates the at least one characteristic parameter $R_s$, $R_{req}$, Lf, L according to said stator voltage $U_s$ and stator current $I_s$ values. The respective stator voltage $U_s$ and stator current $I_s$ values are typically calculated according to a respective transformation, such as the Clark's transformation, applied to the respective voltages measurements $U_1$, $U_2$ and currents measurements $I_1$, $I_2$ for said two phases 22, for example according to equations (1) and (2), or to equations (3) and (4).

Further, when the calculated characteristic parameter of the electric machine 12 is the stator resistance $R_s$, the calculation module 36 for example calculates said stator resistance $R_s$ from the integral of the stator voltage $U_s$ and the integral of the stator current $I_s$ over the duration of the current injection 32, typically according to aforementioned equation (5) or (6).

When the calculated characteristic parameter of the electric machine 12 is the rotor resistance $R_{req}$, the calculation module 36 further calculates the total resistance $R_{tot}$ from the stator voltage $U_s$ and stator current $I_s$ at the time instant $t_0$ corresponding to the maximum of the stator current $I_s$ further to the generation of the current injection 32, typically according to aforementioned equation (7) or (8).

When the calculated characteristic parameter of the electric machine 12 is the leakage inductance Lf, the calculation module 36 for example calculates said leakage inductance Lf from the stator voltage $U_s$ and the time derivative of the stator current $I_s$ further to the generation of the current injection 32, typically according to aforementioned equation (9), (10) or (11).

When the calculated characteristic parameter of the electric machine 12 is the main inductance L, the calculation module 36 for example calculates said main inductance L from the leakage inductance Lf, the stator current $I_s$ and the integral $\varphi_s$ of the stator flux $\Psi_s$ over the duration of the current injection 32, typically according to aforementioned equations (12) and (13).

In the example of FIG. 1, during the initial control step 100, the switching arms 24 for phases U and V are for example controlled to close and the one for phase W controlled to open, so that the current injection 32 is generated on phases U, V and the acquisition step 110, the calculation step 120 are then carried out for these two phases U, V.

Then, during next step 130, also called first repetition step 130, the electronic determination device 20 repeats, respectively via its control module 30, its acquisition module 34 and its calculation module 36, the control step 100, the acquisition step 110 and the calculation step 120 for another phase 22 being open.

For example, during the first repetition step 130, the switching arms 24 for phases U and W are controlled to close and the one for phase V controlled to open, so that the current injection 32 is generated on phases U, W and the first repetition step 130 is further carried out for these two phases U, W.

Then, during next step 140, also called second repetition step 140, the electronic determination device 20 repeats, respectively via its control module 30, its acquisition module 34 and its calculation module 36, the control step 100, the acquisition step 110 and the calculation step 120 for yet another phase 22 being open.

For example, during the second repetition step 140, the switching arms 24 for phases V and W are controlled to close and the one for phase U controlled to open, so that the current injection 32 is generated on phases V, W and the first repetition step 130 is further carried out for these two phases V, W.

Lastly, during next step 150, the electronic determination device 20 monitors, via its diagnostic module 38, the electric machine 12 according to the at least one calculated characteristic parameter $R_s$, $R_{req}$, Lf, L of the electric machine 12. In particular, and according to the optional aspect, the diagnostic module 38 compares the at least two values determined for a respective characteristic parameter $R_s$, $R_{req}$, Lf, L over the successive sequences and generates the alarm signal in the event of a deviation between these at least two determined values exceeding the predefined threshold.

The skilled person will observe that the electronic determination device 20 carries out a given sequence only once for the determination of the at least one characteristic parameter $R_s$, $R_{req}$, Lf, L; or else carries out two or three respective sequences successively by changing the open arm of the electric starter 14 from one sequence to the other, thereby allowing the diagnostic of the electric machine 12.

Furthermore, the electronic determination device 20 carries out a given sequence or successive sequences on a regular basis, for example:

at each startup of the electric machine 12, which allows typically the initialization of a thermal state of the electric machine 12 for purpose of protection, and the identification of the machine resistances for better torque control;

at each stop of the electric machine 12, for example to estimate a current thermal state of the electric machine 12, and allow or block the next machine start during a given time;

on demand, to compare the results and see a potential deviation in the evolution of the different machine resistances. In addition, if—further to the aforementioned comparison—an imbalance is detected between phases 22 of the electric machine 12, then it is recorded.

This determination of the at least one characteristic parameter $R_s$, $R_{req}$, Lf, L of the electric machine 12 allows several advantages. Based on the calculated stator resistance $R_s$, the torque estimation is improved for a better torque control of the electric machine 12. Further, the calculated stator resistance $R_s$ and inductance L allow a better estimation of a mechanical speed of the electric machine 12. Another benefit is the estimation of the machine thermal state based on the calculated stator resistance $R_s$ and the calculated rotor resistance $R_{req}$. Based on this data, the protection of the electric machine 12 is improved and the electric starter 14 can authorize or not a next start of the electric machine 12 or begin a temporization before the next start of the electric machine 12.

Figure 4:
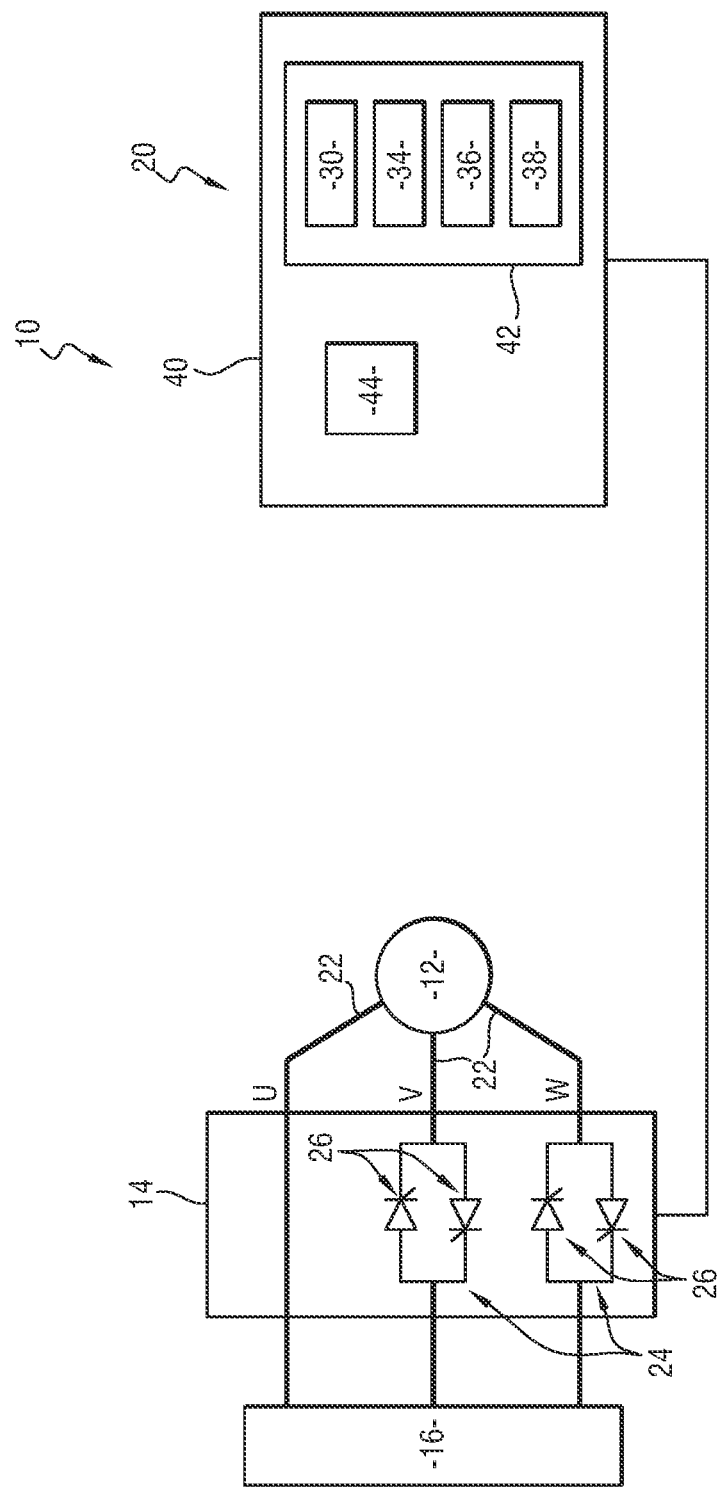
FIG. 4 is a view similar to FIG. 1 according to a second embodiment.
Figure 5:
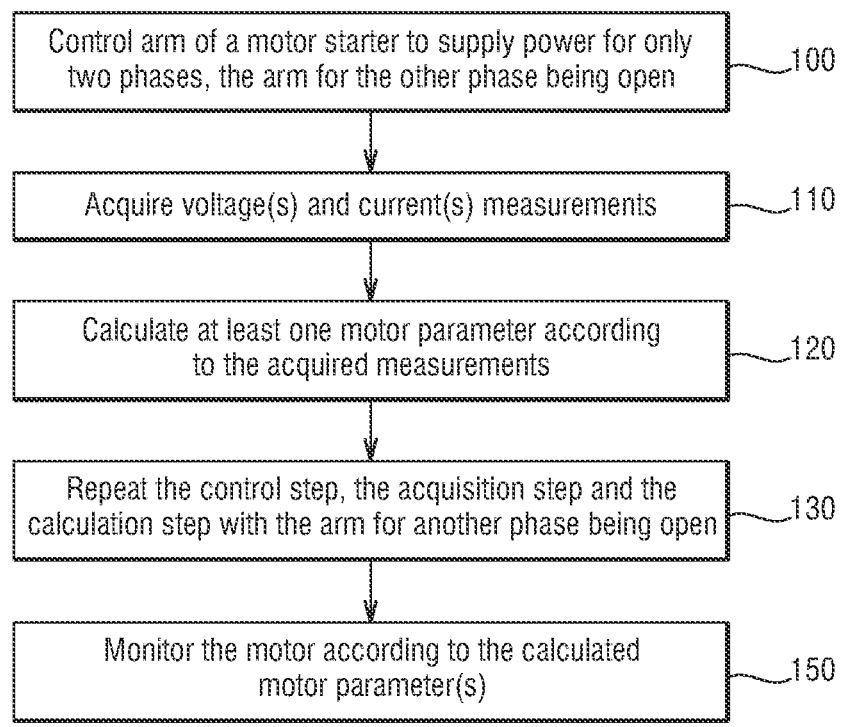
FIG. 5 is a view similar to FIG. 3 according to the second embodiment.

FIGS. 4 and 5 illustrate a second embodiment, for which elements similar to the first embodiment described above are identified by identical references.

According to the second embodiment, the electric starter 14 includes only P-1 switching arms 24, namely a switching arm 24 for P-1 phases 22 of the electric machine 12 while the remaining phase 22 of the electric machine 12 is directly and permanently, i.e. continuously, connected to the alternative power source 16, in particular to its corresponding phase.

According to this second embodiment, the control module 30 is configured to control one respective switching arm 24 to close and the other switching arm(s) 24 to open, so as to generate the current injection 32 on two phases 22, namely on the phase for which the switching arm 24 is controlled to close and on the phase which is permanently connected to the alternative power source 16. In other words, according to this second embodiment, the control module 30 is configured to control a single respective switching arm 24 to close and (P-2) switching arm(s) 24 to open, so as to generate said current injection 32. In the example of FIG. 4, where P is in particular equal to 3, the control module 30 is therefore configured to control a respective switching arm 24 to close and the other switching arm 24 to open, so as to generate said current injection 32.

In addition, the control module 30 is configured, further to the generation of the current injection 32 occurring at an initial time instant $t_{init}$, to control at an end time instant $t_{end}$ the respective previously closed switching arm 24 to open, so as to switch off the current injection 32.

According to the optional aspect, in the example of FIG. 4, the determination device 20 is configured for determining a respective characteristic parameter $R_s$, $R_{req}$, Lf, L of the electric machine 12 in two successive sequences. Therefore, the open switching arm 24 varies from one sequence to the other, preferably so that each one of the two switching arms 24 is opened once during the two successive sequences.

Accordingly, in the example of FIG. 4, the diagnostic module 38 is configured for comparing the two values determined for a respective characteristic parameter $R_s$, $R_{req}$, Lf, L over the two successive sequences and for generating an alarm signal in the event of a deviation between these two determined values exceeding a predefined threshold.

The operation of the power supply chain 10, in particular the determination device 20, according to the second embodiment will now be explained in view of FIG. 5 representing a flowchart of a method, according to the second embodiment, for determining the at least one characteristic parameter $R_s$, $R_{req}$, Lf, L of the electric machine 12.

According to the second embodiment, in initial step 100, the electronic determination device 20 controls, via its control module 30, one respective switching arm 24 to close and the other switching arm(s) 24, i.e. P-2 switching arm(s) 24, to open, so as to generate the current injection 32 on two phases 22 of the electric machine 12. In the example of FIG. 4, with P equal to 3, the control module 30 therefore controls one respective switching arm 24 to close and the other switching arm 24 to open, for generating said current injection 32.

According to the second embodiment, the acquisition step 110, the calculation step 120, the first repetition step 130 and the monitoring step 150 are similar to the acquisition step 110, the calculation step 120, the first repetition step 130 and the monitoring step 150 of the first embodiment, described above, and are therefore not described again.

The skilled person will observe that the second repetition step 140 is not carried out according to the second embodiment, since there is one phase for which the electric starter 14 is not open due to the permanent connection of the electric machine 12 to the alternative power source 16 for said phase. In the example of FIG. 4, said phase for which the electric starter 14 is not open is the phase U.

In other words, in the example of FIG. 4, during the initial control step 100, the switching arm 24 for phase V is for example controlled to close and the switching arm 24 for phase W controlled to open, so that the current injection 32 is generated on phases U, V and the acquisition step 110, the calculation step 120 are then carried out for these two phases U, V.

Then, during the first repetition step 130, the switching arm 24 for phase W is controlled to close and the switching arm 24 for phase V controlled to open, so that the current injection 32 is generated on phases U, W and the first repetition step 130 is further carried out for these two phases U, W.

The advantages of the second embodiment are similar to those of the first embodiment, described above, and are therefore not described again.

The invention claimed is:

1. An electronic determination device for determining at least one characteristic parameter of an electric machine connected to an electric starter, the electric machine having P phases, P being equal to 3, the electric starter being adapted to be connected to an alternative power source and including at least P-1 switching arms, each switching arm being connected to a respective phase of the electric machine, the determination device comprising:
a control module configured to control respective switching arm(s) to close and the other switching arm(s) to open, so as to generate a current injection on two phases of the electric machine;

an acquisition module configured to acquire measurements of respective current(s) and voltage(s) for said two phases, further to the generation of the current injection; and a calculation module configured to calculate at least one characteristic parameter of the electric machine according to the respective current(s) and voltage(s) measurements, wherein the determination device is configured to determine a respective characteristic parameter of the electric machine in at least two successive sequences, and wherein, during each sequence, the control module is configured to control respective switching arm(s) to close and the other switching arm to open, so as to generate a current injection on two phases of the electric machine; the acquisition module being configured to acquire measurements of respective current(s) and voltage(s) for said two phases, further to the generation of the current injection; and the calculation module being configured to calculate the characteristic parameter of the electric machine according to the respective current(s) and voltage(s) measurements for the respective sequence, and wherein the open switching arm varies from one sequence to the other, so that each one of at least two switching arms is opened once during the successive sequences.

2. The device according to claim 1, wherein each characteristic parameter is chosen from among the group comprising:

a stator resistance of the electric machine;

a rotor resistance of the electric machine;

a leakage inductance of the electric machine; and a main inductance of the electric machine.

3. The device according to claim 1, wherein the control module is configured, further to the generation of the current injection occurring at an initial time instant, to control at an end time instant the respective previously closed switching arm(s) to open, so as to switch off the current injection;

a duration of the current injection between the initial time instant and the end time instant being preferably a predefined time period;

the predefined time period being preferably greater than five times a rotor time constant.

4. The device according to claim 1, wherein the calculation module is configured to calculate a value of a stator voltage for a stator of the electric machine from the voltages measurements for said two phases, and respectively a value of a stator current for the stator from the currents measurements for said two phases, the calculation module being further configured to calculate the at least one characteristic parameter of the electric machine according to said stator voltage and stator current values.

5. The device according to claim 1, wherein the calculation module is configured to calculate the respective stator voltage and stator current values according to a transformation applied to the respective voltages measurements and currents measurements for said two phases;

the calculation module being preferably configured to calculate the respective stator voltage and stator current values according to the following equations:

$$U_s = \frac{U_1 - U_2}{2}$$

$$I_s = I_1 = -I_2$$

where $U_s$ represents the stator voltage, $U_1$, and respectively $U_2$, represent the voltage in a first phase, and respectively in a second phase;

$I_s$ represents the stator current, and $I_1$, and respectively $I_2$, represent the current in a first phase, and respectively in a second phase.

6. The device according to claim 4, wherein the calculation module is configured to calculate a total resistance of the electric machine from the stator voltage and stator current at a time instant corresponding to a maximum of the stator current further to the generation of the current injection, the total resistance being equal to the sum of a stator resistance and a rotor resistance of the electric machine;

the calculation module being preferably configured to calculate the total resistance according to the following equation:

$$R_{tot} = (R_s + R_{req}) = \frac{U_s(t_0)}{I_s(t_0)}$$

where $R_{tot}$ represents the total resistance, $U_s$ represents the stator voltage, $I_s$ represents the stator current, and $t_0$ represents the time instant corresponding to a maximum of the stator current.

7. The device according to claim 4, wherein the calculation module is configured to calculate a leakage inductance of the electric machine from the stator voltage and a time derivative of the stator current further to the generation of the current injection;

the calculation module being preferably configured to calculate the leakage inductance according to the following equation:

$$L_f \frac{dI_s}{dt} = U_s$$

where $L_f$ represents the leakage inductance, $U_s$ represents the stator voltage, and $I_s$ represents the stator current.

8. The device according to claim 4, wherein the control module is configured, further to the generation of the current injection occurring at an initial time instant, to control at an end time instant the respective previously closed switching arm(s) to open, so as to switch off the current injection;

a duration of the current injection between the initial time instant and the end time instant being preferably a predefined time period;

the predefined time period being preferably greater than five times a rotor time constant; and wherein the calculation module is configured to calculate a stator resistance of the electric machine from an integral of the stator voltage and an integral of the stator current over the duration of the current injection;

the calculation module being preferably configured to calculate the stator resistance according to the following equation:

$$R_s = -\frac{\int_{t_{init}}^{t_{end}=t_{init}+T} U_s dt}{\int_{t_{init}}^{t_{end}=t_{init}+T} I_s dt}$$

where $R_s$ represents the stator resistance,
$U_s$ represents the stator voltage,
$I_s$ represents the stator current,
$t_{init}$ represents the initial time instant of the measurement during current injection,
$t_{end}$ nd represents the end time instant of said measurement, and
T represents the duration of said measurement.

9. The device according to claim 8, wherein the calculation module is configured to calculate a main inductance of the electric machine from a leakage inductance of the electric machine, the stator current and an integral of a stator flux over the duration of the current injection;
the calculation module being preferably configured to calculate the main inductance according to the following equation:

$$L = \frac{(\varphi_s - L_f I_s)}{I_s}$$

where L represents the main inductance,
Lf represents the leakage inductance,
$I_s$ represents the stator current, and
$\varphi_s$ represents the integral of the stator flux over duration of the current injection;
$\varphi_s$ being preferably defined according to the following equation:

$$\varphi_s = \int_{t_{init}}^{t_{end}=t_{init}+T}(U_s - R_s I_s)dt$$

$R_s$ represents the stator resistance,
$U_s$ represents the stator voltage,
$I_s$ represents the stator current,
$t_{init}$ represents the initial time instant of the current injection,
$t_{end}$ represents the end time instant of the current injection, and
T represents the duration of the current injection.

10. The device according to claim 1, wherein the determination device further comprises a diagnostic module configured to compare the at least two values determined for a respective characteristic parameter over the successive sequences and to generate an alarm signal in the event of a deviation between these at least two determined values exceeding a predefined threshold.

11. A power supply chain for an electric machine, the electric machine having P phases, P being equal to 3, the power supply chain comprising:
an electric starter being adapted to be connected between an alternative power source and the electric machine, the electric starter including at least P-1 switching arms, each switching arm being adapted to be connected to a respective phase of the electric machine,
an electronic determination device for determining at least one characteristic parameter of the electric machine, wherein the electronic determination device is according to claim 1.

12. A method for determining at least one characteristic parameter of an electric machine connected to an electric starter, the electric machine having P phases, P being equal to 3, the electric starter being adapted to be connected to an alternative power source and including at least P-1 switching arms, each switching arm being connected to a respective phase of the electric machine,
the method being implemented by an electronic determination device and comprising:
controlling respective switching arm(s) to close and the other switching arm(s) to open, so as to generate a current injection on two phases of the electric machine;
acquiring measurements of respective current(s) and voltage(s) for said two phases, further to the generation of the current injection; and
calculating at least one characteristic parameter of the electric machine according to the respective current(s) and voltage(s) measurements,
wherein a respective characteristic parameter of the electric machine is determined in at least two successive sequences, and
wherein, during each sequence, respective switching arm(s) are controlled to close and the other switching arm is controlled to open, so as to generate a current injection on two phases of the electric machine; measurements of respective current(s) and voltage(s) are acquired for said two phases, further to the generation of the current injection; and the characteristic parameter of the electric machine is calculated according to the respective current(s) and voltage(s) measurements for the respective sequence, and
wherein the open switching arm varies from one sequence to the other, so that each one of at least two switching arms is opened once during the successive sequences.

13. A non-transitory computer-readable medium having a computer program including software instructions stored thereon which, when executed by a processor, cause the electronic determination device to implement the method according to claim 12.

14. An electronic determination device for determining at least one characteristic parameter of an electric machine connected to an electric starter, the electric machine having P phases, P being equal to 3, the electric starter being adapted to be connected to an alternative power source and including at least P-1 switching arms, each switching arm being connected to a respective phase of the electric machine,
the determination device comprising:
a processor; and
a memory in communication with the processor, the memory storing processor executable instructions, which when executed by the processor cause the electronic determination device to perform:
controlling respective switching arm(s) to close and the other switching arm(s) to open, so as to generate a current injection on two phases of the electric machine;
acquiring measurements of respective current(s) and voltage(s) for said two phases, further to the generation of the current injection; and
calculating at least one characteristic parameter of the electric machine according to the respective current(s) and voltage(s) measurements,
wherein a respective characteristic parameter of the electric machine is determined in at least two successive sequences, and
wherein, during each sequence, respective switching arm(s) are controlled to close and the other switching arm is controlled to open, so as to generate a current injection on two phases of the electric machine; measurements of respective current(s) and voltage(s) are acquired for said two phases, further to the generation of the current injection; and the characteristic parameter of the electric machine is calculated according to the respective current(s) and voltage(s) measurements for the respective sequence, and wherein the open switching arm varies from one sequence to the other, so that each one of at least two switching arms is opened once during the successive sequences.

* * * * *